United States Patent
Grodzki

(10) Patent No.: US 8,988,075 B2
(45) Date of Patent: Mar. 24, 2015

(54) METHOD FOR SUPPRESSING AND/OR ELIMINATING NOISE SIGNALS IN MAGNETIC RESONANCE IMAGING AND A MAGNETIC RESONANCE APPARATUS THEREFOR

(75) Inventor: David Grodzki, Hannover (DE)

(73) Assignee: Siemens Aktiengesellschaft, Munich (DE)

( * ) Notice: Subject to any disclaimer, the term of this patent is extended or adjusted under 35 U.S.C. 154(b) by 492 days.

(21) Appl. No.: 13/246,907

(22) Filed: Sep. 28, 2011

(65) Prior Publication Data

US 2012/0074941 A1 Mar. 29, 2012

(30) Foreign Application Priority Data

Sep. 29, 2010 (DE) .......................... 10 2010 041 587

(51) Int. Cl.
*G01R 33/44* (2006.01)
*G01R 33/48* (2006.01)
*G01R 33/565* (2006.01)

(52) U.S. Cl.
CPC .......... *G01R 33/4816* (2013.01); *G01R 33/565* (2013.01); *G01R 33/481* (2013.01)
USPC ............................ 324/314; 324/307; 324/309

(58) Field of Classification Search
CPC ............. G01R 33/565; G01R 33/5659; G01R 33/4816
USPC .................................................. 324/300–322
See application file for complete search history.

(56) References Cited

U.S. PATENT DOCUMENTS

| | | | |
|---|---|---|---|
| 7,474,976 B2 * | 1/2009 | Schenkel et al. ............ | 702/85 |
| 7,795,869 B1 * | 9/2010 | Bydder ...................... | 324/309 |
| 8,115,483 B2 * | 2/2012 | Biber ......................... | 324/309 |
| 2002/0087063 A1 * | 7/2002 | Lou ............................ | 600/410 |
| 2007/0255129 A1 * | 11/2007 | Du et al. .................... | 600/410 |
| 2009/0093709 A1 * | 4/2009 | Patel et al. ................. | 600/411 |
| 2010/0033180 A1 * | 2/2010 | Biber et al. ................ | 324/309 |
| 2011/0187367 A1 * | 8/2011 | Feiweier et al. ........... | 324/309 |
| 2011/0245655 A1 * | 10/2011 | Abe et al. ................... | 600/410 |

OTHER PUBLICATIONS

Certified German Priority Application No. DE 10 2010 041 587.1 filed Sep. 29, 2010 (Not Yet Published).

* cited by examiner

*Primary Examiner* — Melissa Koval
*Assistant Examiner* — Rishi Patel
(74) *Attorney, Agent, or Firm* — Harness, Dickey & Pierce

(57) ABSTRACT

A method is disclosed for suppressing and/or eliminating noise signals during magnetic resonance imaging by way of a magnetic resonance sequence including an ultra-short echo time. In at least one embodiment, the method includes a recording step for recording magnetic resonance signals of an object to be examined, especially a partial region of a patient, by way of the magnetic resonance sequence, wherein in a noise signal determination step at least one item of information about at least one noise signal of a noise element, especially of a magnetic resonance antenna element, is made available.

12 Claims, 3 Drawing Sheets

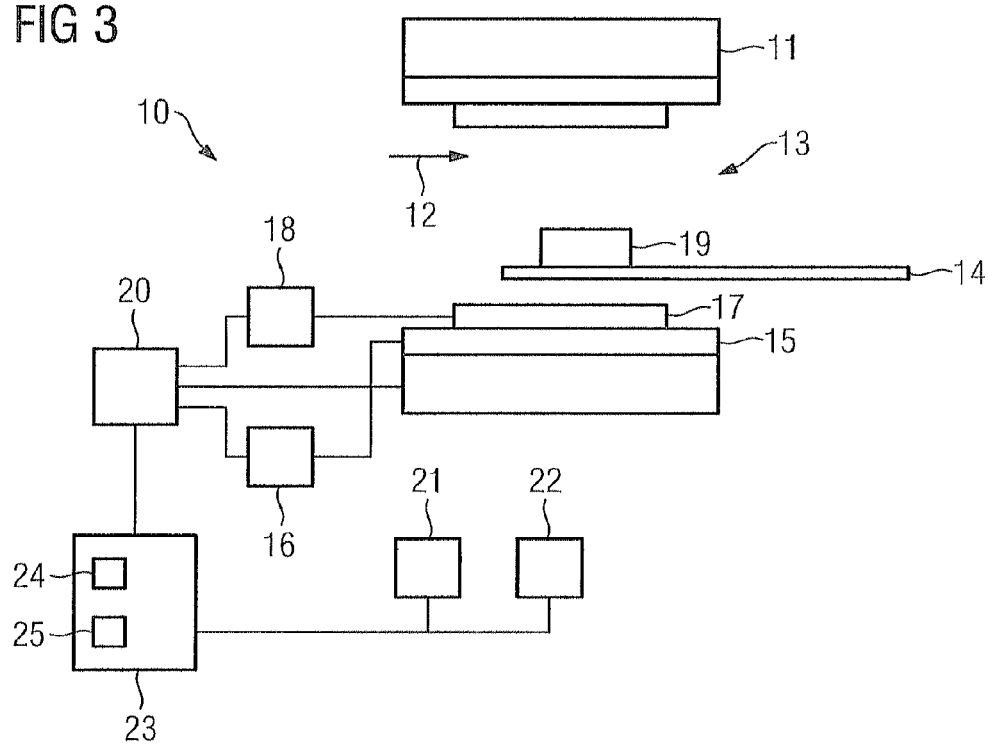

METHOD FOR SUPPRESSING AND/OR ELIMINATING NOISE SIGNALS IN MAGNETIC RESONANCE IMAGING AND A MAGNETIC RESONANCE APPARATUS THEREFOR

PRIORITY STATEMENT

The present application hereby claims priority under 35 U.S.C. §119 on German patent application number DE 10 2010 041 587.1 filed Sep. 29, 2010, the entire contents of which are hereby incorporated herein by reference.

FIELD

At least one embodiment of the invention is based on a method for suppressing and/or eliminating noise signals during magnetic resonance imaging by way of a magnetic resonance sequence having an ultra-short echo time. In at least one embodiment, the method includes recording magnetic resonance signals of an object to be examined, especially a partial region of a patient, by way of the magnetic resonance sequence.

BACKGROUND

Magnetic resonance measurements by way of a magnetic resonance sequence having very short echo times of less than 500 µs offer new opportunities for using nuclear magnetic resonance tomography. In such applications, materials can be displayed and/or made visible by the magnetic resonance imaging which cannot be displayed by way of magnetic resonance sequences using conventional echo times, since their decay time for the decay of the transverse magnetization is much shorter than the echo times of conventional magnetic resonance sequences and thus their magnetic resonance signal has already decayed at the time that an image is recorded. By contrast, with magnetic resonance sequences having echo times in the range of these decay times it is possible to visualize these materials in the magnetic resonance imaging. For example, the decay times of bones or teeth lie in the range of 30 µs to 80 µs. Magnetic resonance sequences in magnetic resonance imaging having an echo time of less than 500 µs are typically employed in the imaging of bones and/or teeth.

However, for measurements with magnetic resonance sequences having ultra-short echo times of less than and/or equal to 200 µs, noise signals increasingly occur which are caused by magnetic resonance antenna components, especially by bound protons in foam plastic or other magnetic resonance antenna components. These noise signals are evident in magnetic resonance images in that these noise signals can fold into the actual magnetic resonance image and/or can be superimposed with the magnetic resonance image of an object under examination. These noise signals can lead to misinterpretations in automated bone image computations for example. Because of the short decay times of the protons in the magnetic resonance antenna components, these noise signals only occur in measurements with magnetic resonance sequences having very short echo times and should be ignored in measurements with conventional magnetic resonance sequences having long echo times.

SUMMARY

In at least one embodiment of the present invention, a method is provided in which noise signals caused by magnetic resonance antenna components can be eliminated especially quickly and effectively. Advantageous embodiments are described in the subclaims.

At least one embodiment of the invention is based on a method for suppressing and/or eliminating noise signals in magnetic resonance imaging by way of a magnetic resonance sequence having an ultra-short echo time, the method comprising recording magnetic resonance signals of an object to be examined, especially a partial region of a patient, by means of the magnetic resonance sequence.

At least one embodiment of the invention is also based on a magnetic resonance apparatus for carrying out suppressing and/or eliminating noise signals during magnetic resonance imaging by means of a magnetic resonance sequence having an ultra-short echo time, wherein the magnetic resonance apparatus comprises at least one magnetic resonance antenna for recording magnetic resonance signals of an object to be examined, especially a partial region of the patient, wherein the magnetic resonance apparatus includes a computation unit which makes available at least one item of information about at least one noise signal of a noise element, especially an antenna element.

BRIEF DESCRIPTION OF THE DRAWINGS

Further advantages, features and details of the invention will emerge from the example embodiment described below as well as with reference to the drawings, in which:

FIG. 2 shows an image presenting the results of a noise signal measurement with an empty magnetic resonance antenna and FIG. 3 shows a magnetic resonance apparatus in a schematic diagram.

DETAILED DESCRIPTION OF THE EXAMPLE EMBODIMENTS

Figure 1:
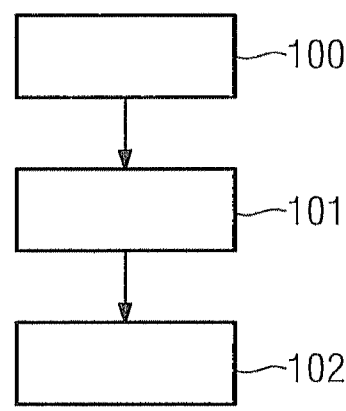
FIG. 1 shows a flow diagram of an inventive method.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

An inventive magnetic resonance apparatus 10 of one embodiment is shown in FIG. 3. The magnetic resonance apparatus 10 comprises a main magnet 11 for generating a strong and constant main magnetic field 12. The magnetic resonance apparatus 10 also has a cylindrical receiving area 13 for receiving a patient, the receiving area 13 being surrounded in a circumferential direction by the main magnet 11. An object to be examined, for example a patient, can be introduced into the receiving area 13 by way of a patient couch 14 of the magnetic resonance apparatus 10.

The magnetic resonance apparatus 10 also has gradient coils 15 for generating magnetic field gradients which are used for spatial encoding during imaging. The gradient coils 15 are controlled by way of a gradient control unit 16. The gradient coils 15 are arranged between the receiving area 13 and the main magnet 11. The magnetic resonance apparatus 10 also has high-frequency antennas 17 and a high-frequency antenna unit 18 for exciting a polarization which becomes established in the main magnetic field 12 generated by the main magnet 11. The high-frequency antennas 17 in this case are arranged between the receiving area 13 and the gradient coils 16 in a fixed position within the magnetic resonance apparatus 10.

In addition the high-frequency antennas 17 are controlled by the high-frequency antenna unit 18 and radiate a high-frequency magnetic resonance sequence into an examination space which is essentially formed by the receiving area. This causes the magnetization to be deflected from its position of equilibrium. Through a deflection of the magnetization generated in the main magnetic field (e.g. in the z direction) a transversal magnetization (e.g. in the x/y plane) is generated of which the decay is able to be detected as induction 10 by way of receive antennas.

These receive antennas of the magnetic resonance apparatus 10 are embodied as local magnetic resonance antennas 19 which are designed for detailed imaging of parts of the body, for example of organs of a patient. For this purpose the local magnetic resonance antennas 19 are applied directly at a point of the patient at which the area to be examined is located. For a magnetic resonance measurement a magnetic resonance sequence is sent by way of the high-frequency antenna 17 arranged between the receiving area 13 and the gradient coils 15 and the induced magnetic resonance signals are received by way of the local receive antenna. Basically it is also conceivable for the high-frequency antenna 17 built into the magnetic resonance apparatus 10 at a fixed position to be provided both for transmitting the magnetic resonance sequence and also for receiving the magnetic resonance signals.

For control of the main magnet 11, of the gradient control unit 16 and for control of the high-frequency antenna unit 18 the magnetic resonance apparatus 10 has a control unit 20. The control unit 20 centrally controls the magnetic resonance apparatus 10, such as the execution of a predetermined imaging gradient echo sequence for example. The magnetic resonance sequence to be executed can be selected with an input unit 21 of the magnetic resonance apparatus 10. Control information, such as imaging parameters for example, and also reconstructed magnetic resonance images can be displayed on a display unit 22 of the magnetic resonance apparatus 10. The magnetic resonance apparatus 10 has a computation unit 23 for evaluation of data and reconstruction of magnetic resonance images. This computation unit 23 comprises a memory unit 24 and a processor unit 25.

The magnetic resonance apparatus 10 shown can of course include further components which magnetic resonance apparatuses usually have. The person skilled in the art is also familiar with the general functions of the magnetic resonance apparatus 10, so no detailed description of the general components will be provided.

FIG. 1 also shows an inventive method for suppression and/or elimination of noise signals in magnetic resonance imaging by way of a magnetic resonance sequence having an ultra-short echo time. The ultra-short echo time of the magnetic resonance sequence is in this case less than and/or equal to 500 µs and especially advantageously less than and/or equal to 200 µs. Initially, in a noise signal determination step 100, information is provided about noise signals of a noise element by the computation unit 23 at least partly independently.

The noise element is formed in the present example embodiment by the local magnetic resonance antenna 19, the antenna having components, for example a foam plastic arranged within the local magnetic resonance antenna, which as a result of excitation by means of the magnetic resonance sequence deliver a noise signal formed by a magnetic resonance signal within these ultra-short echo times. The information about the noise signals can be formed in such cases by the noise signals together with a local point of transmission of the noise signals within the local magnetic resonance antenna and/or further parameters of the noise signals appearing useful to the person skilled in the art. Preferably the information about the noise signals of the noise element is also stored within the memory unit 24 of the computation unit 23, such as is useful for example with local magnetic resonance antennas 19 which assume an identical position in relation to the patient couch 14 for each magnetic resonance measurement. In addition storage of the information in a memory unit embodied separately from the computation unit 23 is also conceivable.

If the local magnetic resonance antenna 19 is formed by a local head coil for example, this head coil is fixed for each magnetic resonance measurement at an identical position on and/or at the patient couch 14. An alignment and arrangement of the head coil within the examination space are known as a result of this so that the coil parameters for the noise signals resulting from the local head coil remain essentially the same. In this case the information about the noise signals is retrieved automatically from the memory unit 24 by the computation unit 23, wherein the computation unit 23 can also be designed for an assignment of a noise parameter dataset to the local magnetic resonance antenna 19 to be undertaken automatically on the basis of additional coil parameters recorded during a measurement process. As an alternative to this the assignment can also be made manually by an operator of the magnetic resonance apparatus 10. By way of the information about the noise signals a three-dimensional structure of transmission locations of the noise signals of the local magnetic resonance antenna 19 is created by the computation unit 23.

Figure 2:
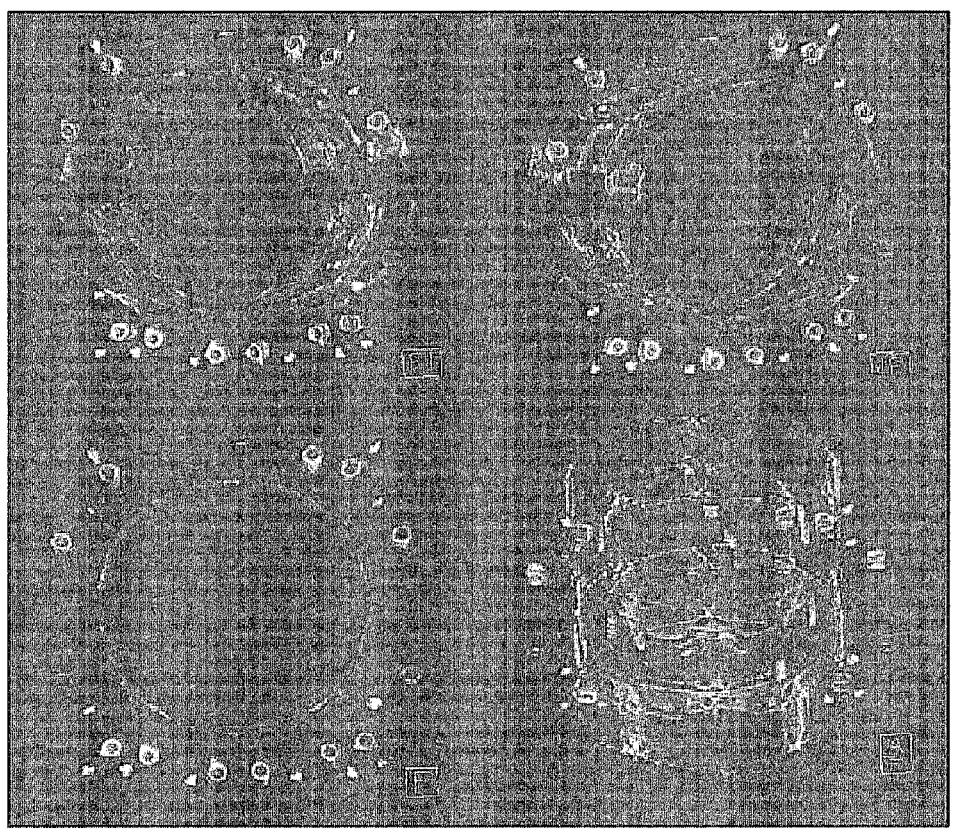

Furthermore, in the noise signal determination step 100 there can also be a noise signal measurement, as is especially useful for local magnetic resonance antennas 19 of which the position and/or alignment in relation to the patient couch 14 depend on a position and/or further parameters of the patient such as size for example. In this case the noise signal measurement is undertaken before the magnetic resonance measurement with the empty magnetic resonance antenna 19, i.e. without a patient. For this noise signal measurement the empty local magnetic resonance antenna 19 is positioned exactly at the position on the patient couch 14 which it also assumes during the magnetic resonance measurement together with the patient. Subsequently the noise signal is measured with advantageously exactly the same parameters or advantageously exactly the same measurement sequence having the ultra-short echo time which is also provided for the magnetic resonance measurement on the patient. The noise signal measurement is started manually by an operator, noise signal recording during the noise signal measurement being undertaken automatically by the computation unit 23. FIG. 2 shows evaluated magnetic resonance images of a noise signal measurement from different directions of view onto a local magnetic resonance antenna 19 embodied as a knee coil.

In addition the computation unit 23 can automatically display to operating personnel of the magnetic resonance apparatus 10 via the display unit 21 that a prior noise signal measurement is required if the local magnetic resonance antenna 19 is to be used for the magnetic resonance measurement. After recording of the noise signal measurement these measured parameters are stored by the computation unit 23 in the memory unit 24. In addition a noise signal measurement may also be required for a local magnetic resonance antenna 19 for which, although it is always positioned in a predetermined fixed position at and/or on the patient couch 14 for a magnetic resonance measurement, no noise parameter dataset is yet stored or available within the memory unit 24.

Subsequently, in a recording step 21, a magnetic resonance measurement is recorded with the patient. For the magnetic resonance measurement with the patient the magnetic resonance sequence having the ultra-short echo time is also selected. In this case, by way of the high-frequency antenna 17 arranged at a fixed position within the magnetic resonance apparatus 10 the magnetic resonance sequence with the ultra-short echo times is transmitted and the magnetic resonance measurement or, to be more specific, the magnetic resonance signals emitted by protons are recorded by means of the local magnetic resonance antenna 19. The magnetic resonance measurement is controlled by the control unit 20, the data recorded by means of the magnetic resonance measurement being evaluated within the computation unit 23.

After the recording of the magnetic resonance measurement in the recording step 101, in an elimination step 102 the noise signals are eliminated and/or computationally removed from the data of the magnetic resonance measurement with the patient by way of the computation unit 23. The computational removal can for example be undertaken by subtracting the data of the noise signals from the data of the magnetic resonance examination with the patient. In addition it is also conceivable for convoluted signals caused by the noise signals to be computationally removed or eliminated from the measurement signals of the magnetic resonance measurement.

In an alternative embodiment of the invention, the noise signal determination step 100 for providing the information about the noise signals can also be undertaken after the recording step 101 for recording the magnetic resonance measurement with the patient.

The information about the noise signals obtained in the noise signal determination step 100 can also be used for further applications by the computation unit 23, such as for example for an improved attenuation correction in magnetic resonance PET measurements, since in such measurements a precise location of a magnetic resonance antenna used and its attenuation of a PET signal can be determined.

At least one embodiment of the invention is based on a method for suppressing and/or eliminating noise signals in magnetic resonance imaging by way of a magnetic resonance sequence having an ultra-short echo time, the method comprising recording magnetic resonance signals of an object to be examined, especially a partial region of a patient, by means of the magnetic resonance sequence.

It is proposed that at least one item of information for at least one noise signal of a noise element, especially of a magnetic resonance antenna element, is made available in a noise signal determination step. At least some of the signals obtained by the magnetic resonance measurement for a noise object or for the object under examination can be uniquely assigned in this way. In addition a misinterpretation of magnetic resonance images can advantageously be prevented by this method and by way of the information about noise signals the noise signal can be eliminated and/or suppressed from the measurement signals especially quickly. The information of the noise signals can also be used for improved attenuation correction in magnetic resonance PET (Positron Emission Tomography) measurements, since in these measurements a precise position of a magnetic resonance antenna used and its attenuation of a PET signal can be determined.

A noise signal in this context is to be understood especially as a signal obtained by means of a magnetic resonance measurement and generated during the magnetic resonance measurement due to noise objects, for example magnetic resonance antenna components and/or further components of a magnetic resonance device provided for recording magnetic resonance signals of an object under examination during the magnetic resonance measurement, especially a patient, and/or for supporting the object under examination during a magnetic resonance measurement. Suppression and/or elimination of noise signals during magnetic resonance imaging are/is especially to be understood as effective separation of the noise signals from measurement data and/or measurement signals of a magnetic resonance measurement, the measurement data and/or measurement signals being caused by an object under examination, especially a patient, during a magnetic resonance measurement. Furthermore an ultra-short echo time is especially to be understood as an echo time for a magnetic resonance sequence which is less than and/or equal to 500 μs and especially advantageously less than and/or equal to 200 μs. The magnetic resonance sequence is understood as a predetermined sequence of high-frequency signals and/or gradient signals.

It is further proposed that in the noise signal determination, the at least one item of information about the noise signal is read out from a memory unit, thereby enabling the noise signal to be accessed particularly quickly after a magnetic resonance measurement so that a rapid signal evaluation for generating at least partly noise-free magnetic resonance images can be achieved. The method can be applied especially advantageously for noise objects that are in the same position for each magnetic resonance measurement, for example a magnetic resonance antenna embodied as a head coil in a fixed position on a patient couch, the arrangement and alignment of which are always the same for all magnetic resonance measurements. The information is preferably read out of the memory unit completely automatically or independently by the computation unit.

In an advantageous development of at least one embodiment of the invention, it is proposed that in the noise signal determination step the at least one item of information relating to the noise signal is recorded by means of at least one noise signal measurement, through which an especially exact localization of the components generating the noise signal can be recorded. This method step can be used especially advantageously for noise objects of which the position and/or location during the magnetic resonance measurement depend on a geometry and/or location of an object under examination, especially a patient.

If the at least one noise signal measurement is undertaken with at least one empty magnetic resonance antenna, the noise signals can especially advantageously be recorded directly. In this context an empty magnetic resonance antenna should especially be understood as a magnetic resonance antenna in which no object under examination is arranged at least for a period of the noise signal measurement.

In an alternative embodiment of the invention, it is proposed that for the least one noise signal measurement a magnetic resonance antenna is positioned at a position at which the magnetic resonance antenna is positioned for a magnetic resonance measurement on the object under examination, through which an alignment and/or location of the magnetic resonance antenna for the noise signal measurement are almost the same as an alignment and/or a location of the magnetic resonance antenna for the magnetic resonance measurement and thus the noise signals can be uniquely assigned to the noise object for the magnetic resonance measurement. In this context a position of the magnetic resonance antenna should especially be understood as a position in relation to a patient couch.

Especially advantageously measurement results of the noise signal measurement are stored, especially in a memory unit of a computation unit, so that the measurement results of the noise signal measurement can be made available for fast data access for further magnetic resonance measurements taking place within the magnetic resonance apparatus in the future. Especially with noise objects which assume an identical predetermined position on a patient couch for each magnetic resonance measurement, such a noise signal measurement can thus be recorded once and its measurement results stored within the magnetic resonance apparatus, especially in a memory unit, for subsequent use for eliminating noise signals from data of a magnetic resonance measurement.

Especially advantageously, in an elimination step by way of the at least one item of information about the noise signal, the latter is eliminated at least partly automatically from the measurement signals, as a result of which a rapid and effective separation of the noise signal from the measurement signals, especially the measurement signals caused by an object under examination, can be achieved. Preferably an elimination of the noise signal is especially to be understood as this noise signal being separated from the magnetic resonance signals which are caused by the object under examination, for example a patient, by this noise signal being computed out of the magnetic resonance signals for example based on the information about the noise signal. Preferably the noise signal is eliminated at least partly automatically and/or independently by way of a processing unit of a magnetic resonance apparatus.

At least one embodiment of the invention is also based on a magnetic resonance apparatus for carrying out a method for suppressing and/or eliminating noise signals during magnetic resonance imaging by means of a magnetic resonance sequence having an ultra-short echo time, wherein the magnetic resonance apparatus comprises at least one magnetic resonance antenna for recording magnetic resonance signals of an object to be examined, especially a partial region of the patient, wherein the magnetic resonance apparatus includes a computation unit which makes available at least one item of information about at least one noise signal of a noise element, especially an antenna element.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for at least one of suppressing and eliminating noise signals in magnetic resonance imaging by way of a magnetic resonance sequence with an ultra-short echo time, the method comprising:

recording magnetic resonance signals of an object to be examined, using a magnetic resonance antenna of a magnetic resonance and the magnetic resonance sequence;

determining at least one noise signal associated with the magnetic resonance antenna caused by the ultra-short echo time of the magnetic resonance sequence, the at least one noise signal leading to image artifacts in magnetic resonance images reconstructed using the magnetic resonance signals, the at least one noise signal being associated with at least one of an alignment and a position of the magnetic resonance antenna; and eliminating the image artifact by at least one of suppressing and eliminating the at least one noise signal from the recorded magnetic resonance signals.

2. The method as claimed in claim 1, wherein the determining the at least one item of information includes reading out the at least one item of information from a memory unit.

3. The method as claimed in claim 1, wherein the determining the at least one item of information includes recording the at least one item of information.

4. The method as claimed in claim 3, wherein the recording the at least one item of information is performed with at least one empty magnetic resonance antenna.

5. The method as claimed in claim 4, wherein the recording the at least one item of information is performed with the magnetic resonance antenna being positioned at a position at which the magnetic resonance antenna is positioned when recording the magnetic resonance signals of the object.

6. The method as claimed in claim 4, further comprising: storing the recorded at least one item of information.

7. The method as claimed in claim 1, wherein at least one of suppressing and eliminating the determined at least one item of information subtracts the at least one item of information from the recorded magnetic resonance signals.

8. A magnetic resonance apparatus configured to carry out at least one of suppressing and eliminating noise signals during magnetic resonance imaging by way of a magnetic resonance sequence with an ultra-short echo time, the magnetic resonance apparatus comprising:

at least one magnetic resonance antenna configured to record magnetic resonance signals of an object under examination using a magnetic resonance antenna of a magnetic resonance apparatus and the magnetic resonance sequence;

a computation unit configured to, determine at least one noise signal associated with the magnetic resonance antenna caused by the ultra-short echo time of the magnetic resonance sequence, the at least one noise signal leading to image artifacts in magnetic resonance images reconstructed using the magnetic resonance signals, the at least one noise signal being associated with at least one of an alignment and a position of the magnetic resonance antenna; and eliminate the image artifact by at least one of suppressing and eliminating the at least one noise signal from the recorded magnetic resonance signals.

9. The method as claimed in claim 2, wherein the at least one magnetic resonance antenna is configured to determine the at least one item of information by recording the at least one item of information.

10. The method as claimed in claim 9, wherein the at least one magnetic resonance antenna is configured to record the at least one item of information with at least one empty magnetic resonance antenna.

11. The method as claimed in claim 10, wherein the at least one magnetic resonance antenna records the at least one item of information with the magnetic resonance antenna being positioned at a position at which the magnetic resonance antenna is positioned when recording the magnetic resonance signals of the object.

12. A non-transitory computer readable medium including program segments for, when executed on a computer device, causing the computer device to implement the method of claim 1.

\* \* \* \* \*